(12) United States Patent
Uhlig et al.

(10) Patent No.: US 8,986,789 B2
(45) Date of Patent: Mar. 24, 2015

(54) STRESS-REDUCED NI-P/PD STACKS FOR BONDABLE WAFER SURFACES

(75) Inventors: Albrecht Uhlig, Berlin (DE); Josef Gaida, Berlin (DE); Christof Suchentrunk, Berlin (DE); Michael Boyle, Rock Hill, SC (US); Brian Washo, Fort Mill, SC (US)

(73) Assignee: Atotech Deutschland GmbH, Berlin (DE)

( * ) Notice: Subject to any disclaimer, the term of this patent is extended or adjusted under 35 U.S.C. 154(b) by 925 days.

(21) Appl. No.: 13/124,349

(22) PCT Filed: Oct. 1, 2009

(86) PCT No.: PCT/EP2009/062756
§ 371 (c)(1),
(2), (4) Date: Apr. 14, 2011

(87) PCT Pub. No.: WO2010/043502
PCT Pub. Date: Apr. 22, 2010

(65) Prior Publication Data
US 2011/0200842 A1 Aug. 18, 2011

(30) Foreign Application Priority Data

Oct. 17, 2008 (EP) ...................................... 08166889

(51) Int. Cl.
| | | |
|---|---|---|
| B05D 3/10 | (2006.01) | |
| H01L 23/00 | (2006.01) | |
| C23C 18/16 | (2006.01) | |
| C23C 18/18 | (2006.01) | |
| C23C 18/36 | (2006.01) | |
| C23C 18/44 | (2006.01) | |
| C23C 18/54 | (2006.01) | |

(52) U.S. Cl.
CPC ............ *H01L 24/05* (2013.01); *C23C 18/1601* (2013.01); *C23C 18/1651* (2013.01); *C23C 18/18* (2013.01); *C23C 18/36* (2013.01); *C23C 18/44* (2013.01); *C23C 18/54* (2013.01); *H01L 24/03* (2013.01); *H01L 2224/0401* (2013.01); *H01L 2224/05124* (2013.01); *H01L 2224/05147* (2013.01); *H01L 2224/05164* (2013.01); *H01L 2224/05644* (2013.01); *H01L 2224/05664* (2013.01); *H01L 2924/01005* (2013.01); *H01L 2924/01011* (2013.01); *H01L 2924/01012* (2013.01); *H01L 2924/01013* (2013.01); *H01L 2924/01015* (2013.01); *H01L 2924/01016* (2013.01); *H01L 2924/01022* (2013.01); *H01L 2924/01027* (2013.01); *H01L 2924/01028* (2013.01); *H01L 2924/01029* (2013.01); *H01L 2924/0103* (2013.01); *H01L 2924/01033* (2013.01); *H01L 2924/01046* (2013.01); *H01L 2924/0105* (2013.01); *H01L 2924/01051* (2013.01); *H01L 2924/01074* (2013.01); *H01L 2924/01078* (2013.01); *H01L 2924/01079* (2013.01); *H01L 2924/01082* (2013.01); *H01L 2924/014* (2013.01); *H01L 2924/01006* (2013.01); *H01L 2924/01019* (2013.01)
USPC .......................... 427/305; 427/304; 427/443.1

(58) Field of Classification Search
USPC ..................... 427/304, 305, 97.9, 99.5, 443.1
See application file for complete search history.

(56) References Cited

U.S. PATENT DOCUMENTS

| | | | |
|---|---|---|---|
| 3,685,582 A | | 8/1972 | Richardson |
| 3,969,554 A | * | 7/1976 | Zeblisky ....................... 427/97.2 |
| 4,125,648 A | * | 11/1978 | Vratny ........................... 427/305 |
| 4,169,171 A | | 9/1979 | Narcus |
| 4,424,241 A | | 1/1984 | Abys |
| 6,150,186 A | | 11/2000 | Chen et al. |
| 6,445,069 B1 | * | 9/2002 | Ling et al. ....................... 257/738 |
| 6,800,121 B2 | * | 10/2004 | Shahin ......................... 106/1.22 |
| 2002/0121709 A1 | | 9/2002 | Matsuki et al. |
| 2005/0048309 A1 | | 3/2005 | Haketa |
| 2006/0086619 A1 | | 4/2006 | Matsui |
| 2008/0264681 A1 | | 10/2008 | Iwai et al. |

FOREIGN PATENT DOCUMENTS

| | | | |
|---|---|---|---|
| DE | 4415211 A1 | * | 12/1994 |
| EP | 0698130 A1 | | 2/1996 |
| EP | 0701281 A2 | | 3/1996 |
| EP | 701281 A2 | * | 3/1996 |
| EP | 1 126 519 A2 | | 8/2001 |

(Continued)

OTHER PUBLICATIONS

B. Lonyuk et al., "Effect of high-phosphorus electroless nickel coating on fatigue life of Al—Cu—Mg—Fe—Ni alloy", Scripta Materialia, vol. 57, pp. 783-786 (2007).
W. Riedel et al., "Electroless Nickel Plating", Finishing Publications Ltd., 1991.
G.O. Mallory et al., "Electroless Plating: Fundamentals and Applications", American Electroplaters and Surface Finishers Society (1989).

*Primary Examiner* — Dah-Wei D Yuan
*Assistant Examiner* — Nga Leung V Law
(74) *Attorney, Agent, or Firm* — Mintz Levin Cohn Ferris Glovsky and Popeo, P.C.; Peter F. Corless

(57) ABSTRACT

The invention relates to a substrate having a bondable metal coating comprising, in this order, on an Al or Cu surface: (a) a Ni—P layer, (b) a Pd layer and, optionally, (c) an Au layer, wherein the thickness of the Ni—P layer (a) is 0.2 to 10 m, the thickness of the Pd layer (b) is 0.05 to 1.0 m and the thickness of the optional Au layer (c) is 0.01 to 0.5 m, and wherein the Ni—P layer (a) has a P content of 10.5 to 14 wt.-%. The deposit internal stress of the resulting Ni—P/Pd stack is not higher than 34.48M–Pa (5,000 psi). Further, a process for the preparation of such a substrate is described.

6 Claims, No Drawings

(56) References Cited

FOREIGN PATENT DOCUMENTS

| JP | 2001-358164 A | 12/2001 |
| JP | 2002-203925 A | 7/2002 |
| JP | 2004-200644 A | 7/2004 |
| JP | 2005-068445 | 3/2005 |
| JP | 2005-072282 A | 3/2005 |
| JP | 2005-183462 A | 7/2005 |
| JP | 2006-128228 A | 5/2006 |
| JP | 2007-258647 A | 10/2007 |
| WO | 94/26954 A1 | 11/1994 |
| WO | 20061040847 A1 | 4/2006 |

* cited by examiner

STRESS-REDUCED NI-P/PD STACKS FOR BONDABLE WAFER SURFACES

FIELD OF THE INVENTION

The present invention relates to a substrate having a bondable metallic coating comprising, on a Al or Cu surface, a Ni—P layer and a Pd layer, which layers have specific thicknesses and reduced stress. Further, the present invention relates to processes for the preparation of such substrates.

BACKGROUND OF THE INVENTION

Electroless nickel palladium gold processes for wire bonding and flip chip soldering are known in the prior art and described, for example, in European patent application EP 0 701 281 A2. Similar processes are described in U.S. Pat. No. 6,445,069 and European patent application EP 1 126 519 A2. The under bump metallisation (UBM) is driven by technological aspects, such as wafer level miniaturisation, electrical signal integrity and metal stack reliability. Wafers are getting thinner and, thus, any applied metal stack can cause undesired warpage of the wafer.

According to the prior art, a Cu or Al layer is coated first on the wafer surface, followed by the plating of Ni—P and Pd (and optionally Au) on individual compartments of the wafer surface ("pads"). The layers of the prior art stacks have a deposit internal stress that results in a warpage of the wafer.

OBJECT OF THE INVENTION

Therefore, it is the object of the present invention to provide Ni—P/Pd stacks for bondable wafer surfaces, which have reduced stress and thereby to minimize or avoid warpage of the wafer.

SUMMARY OF THE INVENTION

This object is achieved by a substrate having a bondable metallic coating comprising, in this order, on an Al or Cu surface: (a) a Ni—P layer, (b) a Pd layer and, optionally, (c) an Au layer, wherein the thickness of the Ni—P layer (a) is 0.2 to 10 µm, the thickness of the Pd layer (b) is 0.05 to 1.0 µm and the thickness of the optional Au layer (c) is 0.01 to 0.5 µm, and wherein the Ni—P layer (a) has a P content of 10.5 to 14 wt.-%. The resulting Ni—P/Pd stack (layers (a) and (b)) generally has a (tensile) deposit internal stress not higher than 34.48 MPa (5,000 psi).

DETAILED DESCRIPTION OF THE INVENTION

The present invention is based on the surprising finding that by selecting the thicknesses of the individual layers of the stack within the above-mentioned ranges and by selecting the above phosphorous content for the Ni—P layer, the deposit internal stress of the resulting Ni—P/Pd stack will be not higher than 34.48 MPa (5,000 psi) tensile or will even be compressive and that warpage of the waver coated with such a stack can thus be minimized or avoided altogether.

In the stack according to the present invention, the Ni—P layer has a thickness ranging from 0.2 to 10 µm, preferably from 0.5 to 3.0 µm.

The Pd layer has a thickness in the range of 0.05 to 1.0 µm, preferably in the range of 0.1 to 0.5 µm.

The optional Au layer has a thickness of 0.01 to 0.5 µm, preferably in the range of 0.01 to 0.3 µm.

The Ni—P layer has a P content in the range of 10.5 to 14 wt.-%. This layer will hereinafter also be referred to as "high-phos Ni—P layer".

The deposit internal stress of the high-phos Ni—P layer is generally compressive (0 to 34.48 MPa (0 to 5,000 psi)). The stress of Ni—P layers with a phosphorus content between 4 wt.-% and about 10.5 wt.-% ("mid-phos") is tensile, whereas a compressive stress is obtained at a high phosphorus ("high-phos") content above 10.5 wt.-% (see W. Riedel, "Electroless Nickel Plating", Finishing Publications Ltd., 1991, p. 111).

The Pd layer preferably has a tensile deposit internal stress not higher than 137.9 MPa (20,000 psi), more preferably not higher than 103.4 MPa (15,000 psi) and most preferably not higher than 68.96 MPa (10,000 psi). In this connection it is noted that prior art Ni—P/Pd stacks (see e.g. U.S. Pat. No. 4,424,241) have a film stress in their Pd layer of as high as 206.9 to 344.8 MPa (30,000 to 50,000 psi) tensile.

The deposit internal stress values of the individual layers can be determined by depositing the layer alone on a copper substrate (test strip) under the same conditions under which they are deposited to produce the stack and measuring the stress of the individual layer by means of a commercially available measuring device.

Next, the preparation of the substrate according to the present invention comprising the stress-reduced Ni—P/Pd stacks for bondable wafer surfaces is described in more detail:

It involves the so-called "under bump metallisation" (UBM), which has been developed in view of recent demands for a wafer level miniaturisation, electrical signal integrity and metal stack reliability.

The UBM process can be generally separated into four different parts.

The first part involves pre-treatment and includes the surface preparation of Al/Al-alloy and Cu pads. For a pre-treatment of Al and Al-alloy different zincations are available, for example Xenolyte™ cleaner ACA™, Xenolyte Etch MA™, Xenolyte CFA™ or Xenolyte CF™ (all available from Atotech Deutschland GmbH) which fulfil the industry standards of cyanide-free chemistry.

The second part in the UBM process involves electroless nickel plating.

In this step of electroless nickel plating, aqueous electroless nickel plating solutions can be used comprising a nickel salt, and hypophosphorous acid or a bath soluble salt thereof selected from sodium hypophosphite, potassium hypophosphite and ammonium hypophosphite. This solution should be free of added nickel hypophosphite, and free of alkali or alkaline earth metal ions capable of forming an insoluble orthophosphate.

In the electroless nickel solutions the operating nickel ion concentration is typically from about 1 up to about 18 grams per liter (g/l), preferably about 3 to about 9 g/l are utilised. Stated differently, the concentration of nickel cation will be in the range of from 0.02 to about 0.3 moles per liter, or preferably in the range of from about 0.05 to about 0.15 moles per liter.

The nickel plating solutions also contain, as a reducing agent, hypophosphite ions derived from hypophosphorous acid or a bath soluble salt thereof such as sodium hypophosphite, potassium hypophosphite and ammonium hypophosphite.

The amount of the reducing agent employed in the plating bath is at least sufficient to stoichiometrically reduce the nickel cation in the electroless nickel reaction to free nickel metal, and such concentration is usually within the range of from about 0.05 to about 1.0 moles per liter. Stated differently, the hypophosphite reducing ions are introduced to provide a hypophosphite ion concentration of about 2 up to about 60 g/l, or from about 12 to 50 g/l or even from about 20 to about 45 g/l. As a conventional practice the reducing agent is replenished during the reaction.

The plating solutions of the present invention which contain nickel and the phosphorus reducing agents such as hypophosphites or the sodium, potassium or ammonium salts thereof, provide a continuous deposit of a nickel-phosphorus alloy coating on the substrate. High levels of phosphorus ("high-phos"), generally about 10.5 wt.-%, and up to about 14 wt.-% by weight are obtained by conducting the plating operation at a pH of between about 3 to about 6, preferably at a pH of from about 4 to 5.6 to provide an alloy deposit having a high phosphorus content.

Other materials may be included in the nickel plating solutions such as buffers, chelating or complexing agents, wetting agents, accelerators, inhibitors, brighteners, etc. These materials are known in the art.

Thus, in one embodiment, a complexing agent or a mixture of complexing agents may be included in the plating solutions. The complexing agents are also referred to in the art as chelating agents. The complexing agents should be included in the plating solutions in amounts sufficient to complex the nickel ions present in the solution and to further solubilise the hypophosphite degradation products formed during the plating process. Generally, the complexing agents are employed in amounts of up to about 200 g/l with amounts of about 15 to about 75 g/l being more typical. In another embodiment, the complexing agents are present in amounts of from about 20 to about 60 g/l.

In one embodiment, carboxylic acids, polyamines or sulfonic acids or mixtures thereof may be employed as the nickel complexing or chelating agents. Useful carboxylic acids include the mono-, di-, tri- and tetra-carboxylic acids. The carboxylic acids may be substituted with various substituent moieties such as hydroxy or amino groups and the acids may be introduced into the plating solutions as their sodium, potassium or ammonium salts. Some complexing agents such as acetic acid, for example, may also act as a buffering agent, and the appropriate concentration of such additive components can be optimised for any plating solution in consideration of their dual functionality.

Examples of such carboxylic acids which are useful as the nickel complexing or chelating agents in the solutions of the present invention include: monocarboxylic acids such as acetic acid, hydroxyacetic acid (glycolic acid), aminoacetic acid (glycine), 2-amino propanoic acid, (alanine); 2-hydroxy propanoic acid (lactic acid); dicarboxylic acids such as succinic acid, amino succinic acid (aspartic acid), hydroxy succinic acid (malic acid), propanedioic acid (malonic acid), tartaric acid; tricarboxylic acids such as 2-hydroxy-1,2,3 propane tricarboxylic acid (citric acid); and tetracarboxylic acids such as ethylene diamine tetra acetic acid (EDTA). In one embodiment, mixtures of 2 or more of the above complexing/chelating agents are utilised in the nickel plating solutions.

The aqueous electroless nickel plating baths of the present invention can be operated over the above mentioned pH range. Since the plating solution has a tendency to become more acidic during its operation due to the formation of hydrogen ions, the pH may be periodically or continuously adjusted by adding bath-soluble and bath-compatible alkaline substances such as sodium, potassium or ammonium hydroxides, carbonates and bicarbonates. The stability of the operating pH of the plating solutions can be improved by the addition of various buffer compounds such as acetic acid, propionic acid, boric acid, or the like, in amounts up to about 30 g/l with amounts of from about 2 to about 10 g/l being typical. As noted above, some of the buffering compounds such as acetic acid and propionic acid may also function as complexing agents.

The electroless nickel plating solutions may also include organic and/or inorganic stabilising agents of the types heretofore known in the art including lead ions, cadmium ions, tin ions, bismuth ions, antimony ions and zinc ions which can be conveniently introduced in the form of bath soluble and compatible salts such as the acetates, etc. Organic stabilisers useful in electroless plating solutions include sulfur-containing compounds such as, for example, thiourea, mercaptans, sulfonates, thiocyanates, etc. The stabilisers are used in small amounts such as from 0.05 to about 5 ppm of solution, and more often in amounts of from about 0.1 to 2 or 3 ppm.

The nickel plating solutions optionally may employ one or more wetting agents of any of the various types heretofore known which are soluble and compatible with the other bath constituents. In one embodiment, the use of such wetting agents prevents or hinders pitting of the nickel alloy deposit, and the wetting agents can be employed in amounts up to about 1 g/l.

The substrate to be plated is contacted with the plating solution at a temperature of at least about 40° C. up to the boiling point of the solution. Electroless nickel plating baths of an acidic type are employed, in one embodiment, at a temperature of from about 70° C. to about 95° C., and more often, at a temperature of from about 80° C. to about 90° C. Electroless nickel plating baths on the alkaline side generally are operated within the broad operating range but generally at a lower temperature than the acidic electroless plating solutions.

The duration of contact of the electroless nickel solution with the substrate being plated is a function which is dependent on the desired thickness of the nickel-phosphorus alloy. Typically, the contact time can range from 1 to 30 minutes.

During the deposition of the nickel alloy, mild agitation generally is employed, and this agitation may be a mild air agitation, mechanical agitation, bath circulation by pumping, rotation of a barrel plating, etc. The plating solution may also be subjected to a periodic or continuous filtration treatment to reduce the level of contaminants therein. Replenishment of the constituents of the bath may also be performed, in some embodiments, on a periodic or continuous basis to maintain the concentration of constituents, and in particular, the concentration of nickel ions and hypophosphite ions, as well as the pH level within the desired limits.

The third step of the UBM process comprises plating from an electroless palladium plating bath.

The electroless palladium bath is described in EP 0 698 130 B1 and was modified for the present invention with an additional stabilizer. Interestingly, it can be used to plate a Pd layer on a high-phos Ni—P layer without previous activation. However, especially for Pd plating at lower temperatures, a step of activating the high-phos Ni—P layer may optionally be carried out before the electroless Pd plating step.

The preferred bath parameters for electroless Pd plating are as follows:
pH: preferred 5 to 6.5, more preferred 5.6 to 6.0
bath temperature: preferred 70 to 90° C., more preferred 82 to 87° C.
Immersion time: preferred 3 to 20 min, more preferred 5 to 10 min
Additional stabilizer: preferred 10 to 500 mg/l, more preferred 100 to 300 mg/l If an activation step is carried out before the electroless Pd plating step, the Pd plating bath temperature may be as low as about 40° C. (and up to about 95° C.). Such activation may be achieved, for example by so-called ionogenic Pd activators which are usually acidic, contain a $Pd^{2+}$ source such as $PdCl_2$ or $PdSO_4$ and deposit a seed layer of elemental Pd on the Ni—P layer. Such activators are well known to the skilled person and are commercially available as solutions under the trademark Xenolyte Activator ACU1™ (product of Atotech Deutschland GmbH). So-called colloidal acidic activators, in which Pd clusters are surrounded by Sn, are equally well-known and may also be used.

The additional stabilizer in a state of the art electroless palladium bath as described in EP 0 698 130 may be used in order to deposit palladium without any additional activation on a high-phos Ni—P layer. Furthermore, such stabilizers allow the electroless deposition of palladium at temperatures between 70° C. and 90° C. which leads to a reduced internal stress of the deposited palladium layer. Known electroless palladium baths show a short lifetime at such high bath temperatures which is not tolerable in industrial applications. The additional stabilizers are selected from the group comprising sulfimides, polyphenylsulfides, pyrimidines, polyalcohols and inorganic complexing agents like rhodanide. A preferred sulfimide is saccharine, preferred pyrimidines are nicotine amide, pyrimidine-3-suphonic acid, nicotinic acid, 2-hydroxy pyridine and nicotine. Preferred poly alcohols are polyethyleneglycol, polypropyleneglycol, polyethylenglycol-polypropyleneglycol copolymers and derivatives thereof.

Finally, the optional gold layer may be plated on the Ni—P/Pd stack. For this purpose, electroless gold plating electrolytes known from prior art can be used. The thickness of the optional gold layer on top of the palladium layer is 0.01 to 0.5 μm, preferably 0.05 to 0.3 μm. The optional gold layer is most preferably deposited by an immersion process. Such immersion processes are described, for example, by H. Kaiser, Edelmetallschichten: Abscheidung, Eigenschaften, Anwendungen; E. Leuze Verlag, 2002, page 43. A suitable bath for electroless gold plating is available commercially under the trademark Aurotech SFplus™ (T=80 to 90° C.; pH=4.5 to 6.0; immersion time=7 to 15 min; 0.5 to 2 g/l Au (as K[Au(CN)$_2$])

Thus, if an Al coated wafer is used in the present invention as a starting substrate, the process comprises the steps of cleaning, etching, zincation (as pretreatment steps), followed by nickel plating, optionally activation of the high-phos Ni—Pd layer, palladium plating and, optionally, gold plating.

If Cu coated wafers are used as the starting substrate, the pre-treatment comprises the steps of cleaning, optionally etching, and Pd activation, followed again by the steps of nickel plating, optionally activation of the high-phos Ni—Pd layer, palladium plating and, optionally, gold plating.

The present invention is further illustrated by the following examples and comparative examples.

Values for internal stress of individual Pd or Ni—P layers as well as Ni—P/Pd stacks were determined with a "Deposit Stress Analyzer" (Model 683; Speciality Testing & Development Co.). Specially designed test strips from the same company were coated with Ni—P, Pd and Ni—P/Pd layers and tested according to the procedure described by the equipment supplier.

Example 1

Comparative Experiment

A pure Pd layer was plated from a state of the art bath (disclosed in EP 0 698 130) with a composition comprising 1 g/l $Pd^{2+}$ ions, 27.6 g/l formic acid and 3 g/l ethylenediamine at a pH of 5.5 and a temperature of 55° C. on a mid-phos Ni—P layer (Xenolyte™ Ni M™, Atotech Deutschland GmbH).

The immersion time of the Ni—P plated (1.3 μm) Cu substrate in the Pd bath was five minutes. The resulting stack stress was 103.4 MPa (15,000 psi) in the tensile direction (for calculation of the stress the sum of the Ni—P and Pd layer thickness was taken into account; the Pd layer thickness was 0.27 μm).

Example 2

Comparative Experiment

A pure Pd layer was plated from a stress reduced Pd bath (disclosed in U.S. Pat. No. 4,424,241) on a mid-phos Ni—P layer (Xenolyte™ Ni M™, Atotech Deutschland GmbH) overlying a Cu substrate. The Cu substrate was immersed for five minutes in the Xenolyte™ Ni M™ bath and after rinsing with deionized water for 5 minutes in the palladium bath.

The Pd bath contained:

| | |
|---|---|
| $Pd^{2+}$ ions | 1 g/l |
| Ethylenediamine | 3 g/l |
| Sodium formate | 40.8 g/l |
| Saccharin sodium salt hydrate | 0.2 g/l (anhydrous basis) |

It had a pH of 5.8 and the bath temperature was 85° C.

The obtained Ni—P/Pd stack had thicknesses of 0.9 μm for the Ni—P layer and 0.21 μm for the Pd layer. The observed overall stack stress was 53.79 MPa (7,800 psi) tensile.

Example 3

The film stress of a Ni—P/Pd stack on Cu with a Ni—P layer from a high-phos Ni—P bath and a pure Pd layer plated from the stress reduced Pd bath used in Example 2 was determined.

The high-phos Ni—P bath contained:

| | |
|---|---|
| $Ni^{2+}$ ions | 6 g/l |
| Na hypophosphite•$H_2O$ | 30 g/l |
| Malic acid | 10 g/l |
| Succinic acid | 18 g/l |
| Lactic acid | 30 g/l |
| Pb ions | 0.2 mg/l |

It had a pH of 4.8 and the bath temperature was 85° C.

The resulting Ni—P layer thickness was 0.92 μm and the Pd layer thickness was 0.19 μm. The resulting stack has a stress value of 21.38 MPa (3,100 psi) tensile.

Example 4

A Pd layer from the Pd bath of Example 1 on a high-phos Ni—P layer (from the high-phos Ni—P bath used in Example 3) was deposited after additional activation of the Ni—P layer by Xenolyte Activator ACU1 (product of Atotech Deutschland GmbH).

A stack thus obtained had an average Ni—P layer thickness of 0.84 μm, a Pd layer thickness of 0.25 μm and an overall stress value of 27.58 MPa (4,000 psi) tensile. The stress of the Ni—P layer was 34.48 MPa (5,000 psi) in the compressive direction prior to the Pd plating.

Example 5

A high-phos Ni layer from a high-phos Ni—P bath (see Example 3 for bath composition) on Cu yielded a small compressive stress slightly decreasing from a thickness from 1 μm (27.58 MPa (4,000 psi) compressive) to at least 3 μm (25.52 MPa (3,700 psi) compressive). After plating of a 0.3 μm Pd layer from the bath with a composition described in Example 2, the overall stack stress was 20.69 MPa (3,000 psi) tensile for 1 μm of Ni—P and 21.38 MPa (3,100 psi) tensile for 3 μm of Ni—P.

Example 6

Comparative Example

A Pd layer from a state of the art bath with a composition as described in Example 1 with a pH of 5.5 and at a temperature of 55° C. directly deposited on Cu with activation by Xenolyte Activator ACU 1 (Atotech Deutschland GmbH) yielded a mean stress value of 241.4 MPa (35,000 psi) tensile.

Example 7

A Pd layer from the stress reduced bath used in Example 2 directly deposited on a Cu substrate with activation by Xenolyte Activator ACU 1 (Atotech Deutschland GmbH) yielded a mean stress value of 89.65 MPa (13,000 psi) tensile at a pH of 5.8 and a bath temperature of 85° C. The Pd bath is additionally stable for at least 48 h on temperature, whereas the state of the art bath from Example 1 will plate out at 85° C. after 3 h.

The invention claimed is:

1. A process for the preparation of a substrate having a bondable metallic coating comprising, in this order, on an Al or Cu surface:
   (a) a Ni—P layer having a thickness of 0.2 to 10 μm and a P content of 10.5 to 14 wt.-%,
   (b) a Pd layer having a thickness of 0.05 to 1.0 μm and, optionally,
   (c) an Au layer having a thickness of 0.01 to 0.5 μm,
   wherein a stack consisting of a Ni—P layer (a) and a Pd layer (b) has a deposit internal stress not higher than 34.48 MPa (5,000 psi),
   the process comprising the following steps:
      (i) immersing a substrate having an Al or Cu surface in a Ni—P plating bath comprising a nickel salt, and hypophosphorus acid or a bath-soluble salt thereof selected from sodium hypophosphite, potassium hypophosphite and ammonium hypophosphite, wherein the solution is free of alkali or alkaline earth metal ions capable of forming an insoluble orthophosphite
   at a temperature of from about 70° C. to about 95° C. and at a pH of from about 3 to about 6 for a period of 1 to 30 min to obtain a Ni—P layer on the substrate and
      (ii) immersing the Ni—P-coated substrate obtained in step (i) in a Pd plating bath comprising at least one palladium ion source, at least one reducing agent, at least one complexing agent and at least one sulfimide stabilizer additive in a quantity of 10 to 500 mg/l
   at a pH of 5 to 6.5 for a period of 3 to 20 min to obtain a Pd layer on the substrate,
   wherein the Pd layer is deposited onto the Ni—P layer obtained in step (i) without any activation of the Ni—P layer prior to deposition of the Pd layer and step (ii) is carried out at a temperature of from about 70 to about 90° C. or
   wherein the Pd layer is deposited onto the Ni—P layer obtained in step (i) after activation of the Ni—P layer and step (ii) is carried out at a temperature of from about 40 to about 95° C.

2. The process according to claim 1 wherein the substrate is an Al wafer, the surface of which is cleaned and etched or followed by zincation prior to step (i).

3. The process according to claim 1 wherein the substrate is a Cu wafer, the surface of which is cleaned, optionally, etched, followed by Pd activation prior to step (i).

4. The process according to claim 1, further comprising: (iii) a step of immersing the substrate coated with the Ni—P layer and the Pd layer into an Au plating bath.

5. The process according to claim 2, further comprising: (iii) a step of immersing the substrate coated with the Ni—P layer and the Pd layer into an Au plating bath.

6. The process according to claim 3, further comprising: (iii) a step of immersing the substrate coated with the Ni—P layer and the Pd layer into an Au plating bath.

* * * * *